United States Patent
Ehrenpfordt et al.

(10) Patent No.: US 9,933,286 B2
(45) Date of Patent: Apr. 3, 2018

(54) SENSOR AND METHOD FOR PRODUCING A SENSOR

(71) Applicant: Robert Bosch GmbH, Stuttgart (DE)

(72) Inventors: Ricardo Ehrenpfordt, Korntal-Muenchigen (DE); Mathias Bruendel, Stuttgart (DE); Frederik Ante, Stuttgart (DE); Johannes Kenntner, Magstadt (DE)

(73) Assignee: Robert Bosch GmbH, Stuttgart (DE)

( * ) Notice: Subject to any disclaimer, the term of this patent is extended or adjusted under 35 U.S.C. 154(b) by 1 day.

(21) Appl. No.: 14/772,173

(22) PCT Filed: Apr. 7, 2014

(86) PCT No.: PCT/EP2014/056898
§ 371 (c)(1),
(2) Date: Sep. 2, 2015

(87) PCT Pub. No.: WO2014/170153
PCT Pub. Date: Oct. 23, 2014

(65) Prior Publication Data
US 2016/0011020 A1    Jan. 14, 2016

(30) Foreign Application Priority Data

Apr. 15, 2013   (DE) .................. 10 2013 206 689

(51) Int. Cl.
*G01D 11/24*   (2006.01)
*H01L 25/16*   (2006.01)
*H01L 23/00*   (2006.01)

(52) U.S. Cl.
CPC ............ *G01D 11/245* (2013.01); *H01L 24/97* (2013.01); *H01L 25/167* (2013.01);
(Continued)

(58) Field of Classification Search
CPC ...................................................... G01D 11/24
(Continued)

(56) References Cited

U.S. PATENT DOCUMENTS

| 6,125,697 A | 10/2000 | Holton et al. |
| 7,422,348 B1 | 9/2008 | Yates, II |

(Continued)

FOREIGN PATENT DOCUMENTS

| CN | 102365754 A | 2/2012 |
| CN | 102436290 A | 5/2012 |

(Continued)

OTHER PUBLICATIONS

International Search Report corresponding to PCT Application No. PCT/EP2014/056898, dated Jun. 23, 2014 (German and English language document) (7 pages).

*Primary Examiner* — Harshad R Patel
*Assistant Examiner* — Jamel Williams
(74) *Attorney, Agent, or Firm* — Maginot, Moore & Beck LLP

(57) ABSTRACT

A sensor comprises a sensor element configured to provide a sensor signal representing at least one measurand detected by the sensor element, an electrical circuit configured to process the sensor signal to form a data signal, a photovoltaic cell configured to provide electrical energy for the sensor element and the electrical circuit, and a housing, in which the sensor element, the electrical circuit and the photovoltaic cell are positioned, the housing including a recess in which the photovoltaic cell is positioned, and a rim surrounding the recess and protruding beyond the photovoltaic cell. A method is also provided.

10 Claims, 7 Drawing Sheets

(52) U.S. Cl.
CPC ............ *H01L 2224/48091* (2013.01); *H01L 2224/48227* (2013.01); *H01L 2224/73265* (2013.01); *H01L 2924/1461* (2013.01); *H01L 2924/15192* (2013.01); *H01L 2924/181* (2013.01); *H01L 2924/19107* (2013.01)

(58) Field of Classification Search
USPC .......................................................... 73/431
See application file for complete search history.

(56) References Cited

U.S. PATENT DOCUMENTS

| | | | | |
|---|---|---|---|---|
| 2011/0169554 A1* | 7/2011 | Keysar | ................... | H01L 25/167 327/530 |
| 2011/0187609 A1* | 8/2011 | Abe | ......................... | H01Q 1/22 343/702 |
| 2012/0000514 A1* | 1/2012 | Amamiya | ......... | C09D 123/0815 136/251 |
| 2012/0044658 A1* | 2/2012 | Ohira | ................... | H05K 5/0017 361/752 |
| 2012/0247551 A1* | 10/2012 | Kim | ................... | H01L 31/0481 136/256 |
| 2014/0184263 A1* | 7/2014 | Ehrenpfordt | ......... | G01D 11/245 324/762.03 |

FOREIGN PATENT DOCUMENTS

| | | | | |
|---|---|---|---|---|
| CN | 102541081 A | | 7/2012 | |
| DE | 197 26 044 A1 | | 2/1999 | |
| DE | 19927687 A1 | * | 12/2000 | ............... A01G 7/00 |
| DE | 10 2008 008 846 A1 | | 9/2009 | |
| DE | 10 2011 105 190 A1 | | 12/2012 | |
| EP | 0 581 218 A1 | | 2/1994 | |
| EP | 0581218 A1 | * | 2/1994 | ............... G01D 3/02 |

\* cited by examiner

SENSOR AND METHOD FOR PRODUCING A SENSOR

This application is a 35 U.S.C. § 371 National Stage Application of PCT/EP2014/056898, filed on Apr. 7, 2014, which claims the benefit of priority to Serial No. DE 10 2013 206 689.9, filed on Apr. 15, 2013 in Germany, the disclosures of which are incorporated herein by reference in their entirety.

BACKGROUND

The present disclosure relates to a sensor and to a method for producing a sensor.

A component can be operated in an energy self-sufficient manner when an energy source or a device for recovering energy is integrated into the component.

US 2011/0169554A1 describes an integrated solar-operated component.

SUMMARY

On this basis, a sensor and a method for producing a sensor is disclosed. Advantageous embodiments will emerge from the following description.

In order to place a photovoltaic cell in a housing, the photovoltaic cell may be arranged in an indentation, set back from a surface of the housing. Due to the set-back arrangement, the photovoltaic cell is better protected against damage than if the photovoltaic cell were arranged flush with the surface. In particular, lateral edges of the photovoltaic cell, at which a sensitive semiconductor material may be exposed, are well protected in the indentation against damage, such as corrosion or rupture.

A sensor is presented that has the following features:
an electronic component or sensor element for providing a sensor signal with use of electrical energy, wherein the sensor signal represents at least one measurand detected by the sensor element;
an electrical circuit for processing the sensor signal to form a data signal with use of electrical energy;
a photovoltaic cell for providing the electrical energy for the sensor element and the electrical circuit, wherein the; and
a housing, by which the sensor element, the electrical circuit and the photovoltaic cell are accommodated, wherein the housing has a recess, in which the photovoltaic cell is arranged, wherein a rim of the housing surrounding the recess protrudes beyond the photovoltaic cell.

An electronic component may be in particular an ASIC, which for example directly measures a temperature. A sensor element may be a microelectromechanical (MEMS) sensor element. The sensor element may be designed to detect at least one measurand. The measurand may be a physical variable. The measurand may be a chemical variable. A sensor signal may be an electrical signal. In particular, the sensor signal may be an analog signal. An electrical circuit may be an integrated circuit. A data signal may be a digital signal in particular. The electrical circuit may be designed to transmit the data signal via a communication protocol to a receiver. A photovoltaic cell may be a back-contact solar cell. Then, electrical contacts of the photovoltaic cell may be contacted from a light-insensitive side of the photovoltaic cell. The photovoltaic cell may also be a solar cell with front-side contact and rear-side contact. Then, the front-side contact may be contacted on the light-sensitive side of the solar cell. A housing may be a protective casing. The housing may be fluid-tight. The housing may be constructed from one or more different materials. The rim of the housing may run peripherally around the recess in a closed manner. The rim may protrude beyond the light-sensitive surface of the photovoltaic cell. A space located between the surface of the photovoltaic cell and an outer surface of the rim, i.e. a region of the recess adjacent to the light-sensitive surface of the photovoltaic cell and not filled by the photovoltaic cell, may be material-free, i.e. filled for example with ambient air, or may be filled with a protective medium. The recess may be formed as a blind bore in a material forming the housing. A depth of the recess, i.e. a distance between a base of the recess and an edge of the rim of the housing adjacent to a side wall may be greater than a thickness of the photovoltaic cell. The rim of the housing may be formed from a printed circuit board material or from a potting compound. In this way the rim may be formed from a hard material, which may shield the photovoltaic cell against external influences.

A transition region between the photovoltaic cell and the housing may be sealed using a protective medium. The transition region may be arranged at an edge that connects the light-sensitive side of the photovoltaic cell to the light-insensitive side of the photovoltaic cell. A protective medium may be a substance that is introduced into the transition region and cures in the transition region. The protective medium may also be permanently flexible, for example in order to compensate for thermal stresses. The protective medium may be transparent. Then, the protective medium may also be arranged over the entire surface of the light-sensitive side of the photovoltaic cell. By way of example, a protective medium may be a protective gel, protective paint or a melt.

The sensor element and alternatively or in addition the electrical circuit may be arranged on a light-insensitive side of the photovoltaic cell. The sensor element and/or the electrical circuit may be arranged in separate semiconductor chips. The semiconductor chips may be placed on the rear side of the photovoltaic cell, before the housing is formed. A printed circuit board with conductive tracks may be arranged between the photovoltaic cell and the sensor element and/or the electrical circuit.

The housing may be formed at least in part by a potting compound. The sensor element and alternatively or additionally the electrical circuit may be potted in the potting compound. A potting compound by way of example may be a plastic that completely surrounds the sensor element and alternatively or additionally the electrical circuit and protects against external influences. The potting compound may be molded in a female tool to provide the housing. The potting compound may be thermoplastic.

Electrical conductive tracks may be arranged in the rim of the housing. The photovoltaic cell may be contacted electrically by the conductive tracks in the rim. The rim may have a protrusion beyond the light-sensitive side of the photovoltaic cell. Part of the light-sensitive side of the photovoltaic cell may thus be covered by the rim. In this case at least one electrical connector of the photovoltaic cell may be contacted on the light-sensitive side.

The photovoltaic cell may be surrounded (embedded) by the rim in such a way that there is contact at least on all sides with the surfaces of the photovoltaic cell, at least in sub-regions of the surfaces. An edge of the photovoltaic cell may be embedded in the rim. The edge may be completely surrounded. The photovoltaic cell may thus be protected particularly well by the housing. The photovoltaic cell may be cast in or encapsulated by injection molding in order to embed the edge in the rim. A printed circuit board can be constructed from a number of layers, wherein at least one layer has a cutout that is large enough for the photovoltaic cell. A cover layer may have a smaller cutout, such that the cover layer protrudes beyond the photovoltaic cell at the edge. The photovoltaic cell may also be placed over the cutout in the cover layer and potted with the electrical circuit and the sensor element from the light-insensitive side.

The housing may have electrical connectors on the rim and alternatively or additionally on a rear side opposite the recess. Connectors may be formed as an interface of the electrical circuit. The electrical connectors may be formed via feedthroughs, or what are known as vias, in the housing. The connectors may be formed identically on both sides of the housing. Then, the connectors can be accessed irrespective of a position of installation. By way of example, a function of the sensor can be checked by means of the connectors.

The electrical circuit may have an antenna for wirelessly transmitting the data signal. Due to a wireless data transmission, the sensor may be placed at any point within a range of a receiver. Cables can thus be spared.

The sensor may have an energy store for the electrical energy, wherein the energy store is surrounded by the housing. An energy store by way of example may be an accumulator or a capacitor. Energy from the photovoltaic cell can be stored in the energy store when there is an energy excess. If there is an energy deficiency, the sensor may be operated with use of the energy in the energy store. By way of example, the sensor may then detect data even in darkness.

A method for producing a sensor is also presented, wherein the method comprises the following steps:
providing a sensor element, an electrical circuit and a photovoltaic cell, wherein the photovoltaic cell is connected to the electrical circuit and the electrical circuit is connected to the sensor element; and
arranging the sensor element, the electrical circuit and the photovoltaic cell in a housing, wherein the photovoltaic cell is arranged in a recess in the housing, wherein a rim of the housing surrounding the recess protrudes beyond the photovoltaic cell.

In the provision step a plurality of arrangements formed of a sensor element, an electrical circuit and a photovoltaic cell can be provided, and in the arrangement step the plurality of arrangements can be arranged in a common housing. The method may comprise a separation step, in which the housing is separated into a plurality of sub-housings, wherein each sub-housing has an arrangement. Manufacturing costs and time can be saved simultaneously by means of a production of a plurality of sensors.

BRIEF DESCRIPTION OF THE DRAWINGS

The disclosure will be explained in greater detail hereinafter by way of example on the basis of the accompanying drawings, in which.

DETAILED DESCRIPTION

In the following description of preferred exemplary embodiments of the present disclosure, like or similar reference signs are used for the similarly acting elements illustrated in the various figures, wherein a repeated description of these elements is spared.

Figure 1:
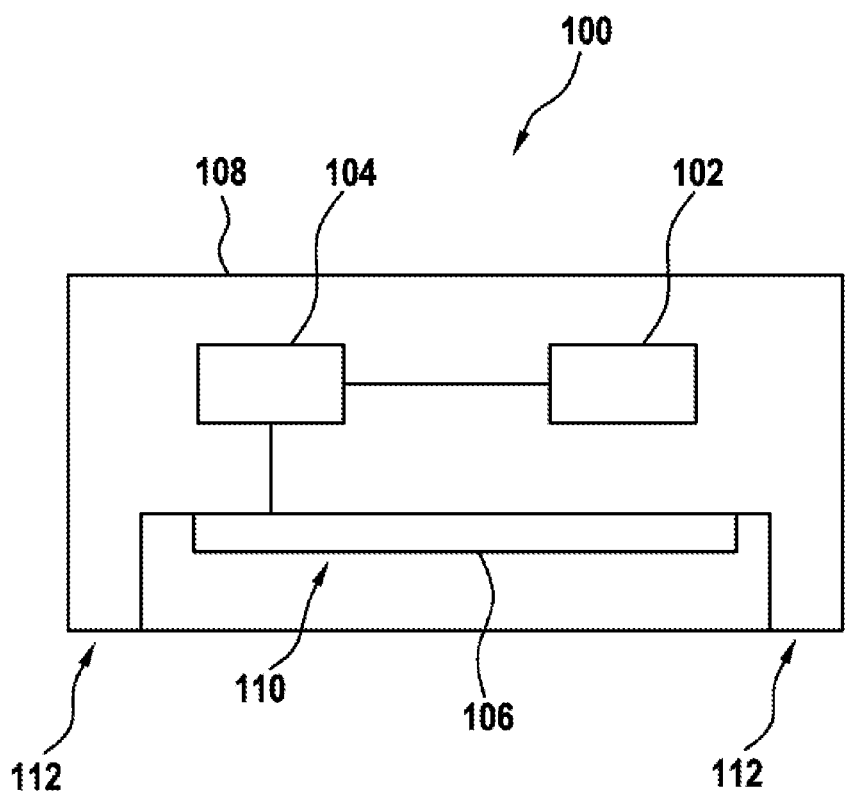
FIG. 1 shows a schematic illustration of a sensor in accordance with an exemplary embodiment of the present disclosure.

FIG. 1 shows a schematic illustration of a sensor 100 in accordance with an exemplary embodiment of the present disclosure. The sensor 100 has a sensor element 102, an electrical circuit 104, a photovoltaic cell 106, and a housing 108. The sensor element 102 is designed to provide a sensor signal with use of electrical energy. The sensor signal represents at least one measurand detected by the sensor element 102. The electrical circuit 104 is connected to the sensor element 102 and is designed to process the sensor signal to form a data signal with use of electrical energy. The photovoltaic cell 106 is designed to provide the electrical energy for the sensor element 102 and the electrical circuit 104 and is connected to the electrical circuit 104. The sensor element 102, the electrical circuit 104 and the photovoltaic cell 106 are arranged in the housing 108. The housing 108 has a recess 110, in which the photovoltaic cell 106 is arranged. A rim 112 of the housing 108, which rim surrounds the recess 110, protrudes beyond the photovoltaic cell 106, such that a light-sensitive surface of the photovoltaic cell 106 is set back behind a surface of the housing 108. In accordance with the exemplary embodiment shown in FIG. 1, the light-sensitive surface of the photovoltaic cell 106 is not covered by the housing 108 or another cover layer or protective layer. There is thus a free space between the rim regions of the recess 110 protruding beyond the light-sensitive surface of the photovoltaic cell 106. In accordance with an alternative exemplary embodiment the light-sensitive surface of the photovoltaic cell 106 may be covered by a cover layer. By way of example, the recess 110 may be filled with a transparent material, which may terminate flush with an outer surface of the rim 112, in FIG. 1 the downwardly pointing surface of the rim 112.

FIG. 1 shows an exemplary embodiment of a design for integration and for protection of one or more photovoltaic cells 106 in sensor systems and sensors 100.

A sensor 100 of this type can be used for example in conjunction with the "Internet of Things" (IoT), which is described as one of the most important future developments in information technology. As a result of the Internet of Things, not only do humans have access to the Internet and not only are they linked thereby, but devices are also linked to one another via the Internet. The examples already technically realized include washing machines with Internet access, which automatically start the washing process when electricity prices are low. Another example would be a linked refrigerator, which automatically reorders the removed food. Another region of the Internet of Things is targeted at production and domestic automation with autonomous sensors 100, which obtain their energy either from batteries and/or with energy harvesters such as photovoltaic cells 106, thermoelectric generators or from vibrations. Sensors 100 of this type may use elements 102 from the field of consumer electronics, such as sensors 102 for smartphones, for example gyroscopes, acceleration sensors, pressure sensors or microphones. Due to be economically available sensor elements 102, sensors 100 can be produced at low overall cost. By way of example, a sensor 100 for detection of the window position at a window frame or a moisture sensor for mildew detection behind a cupboard on the wallpaper thus can be produced economically. Sensor modules 100 for the Internet of Things (overall size a few cm$^3$) may contain not only at least one sensor 102 for the detection of a physical/chemical variable, but may also integrate a processor 104, a radio module, an energy store and an energy harvester 106 in a small installation space.

In the approach presented here a photovoltaic cell 106 is integrated in a small autonomous sensor system 100 with a base area of a few square centimeters, for example with a base area of less than 10, 5 or 3 square centimeters, such that the edges of the photovoltaic cell 106 are protected and a vertical peripheral protrusion 112 of the housing 108 beyond the active surface of the solar cell 106 protects this against mechanical influences, at least in part.

Due to the integration of the photovoltaic cell 106 in the sensor module 100, the lateral edges are protected against external influences and at the same time the active surface of the photovoltaic cell 106 is protected against mechanical stresses by an at least partially vertical peripheral protrusion 112 of the housing.

Figure 2:
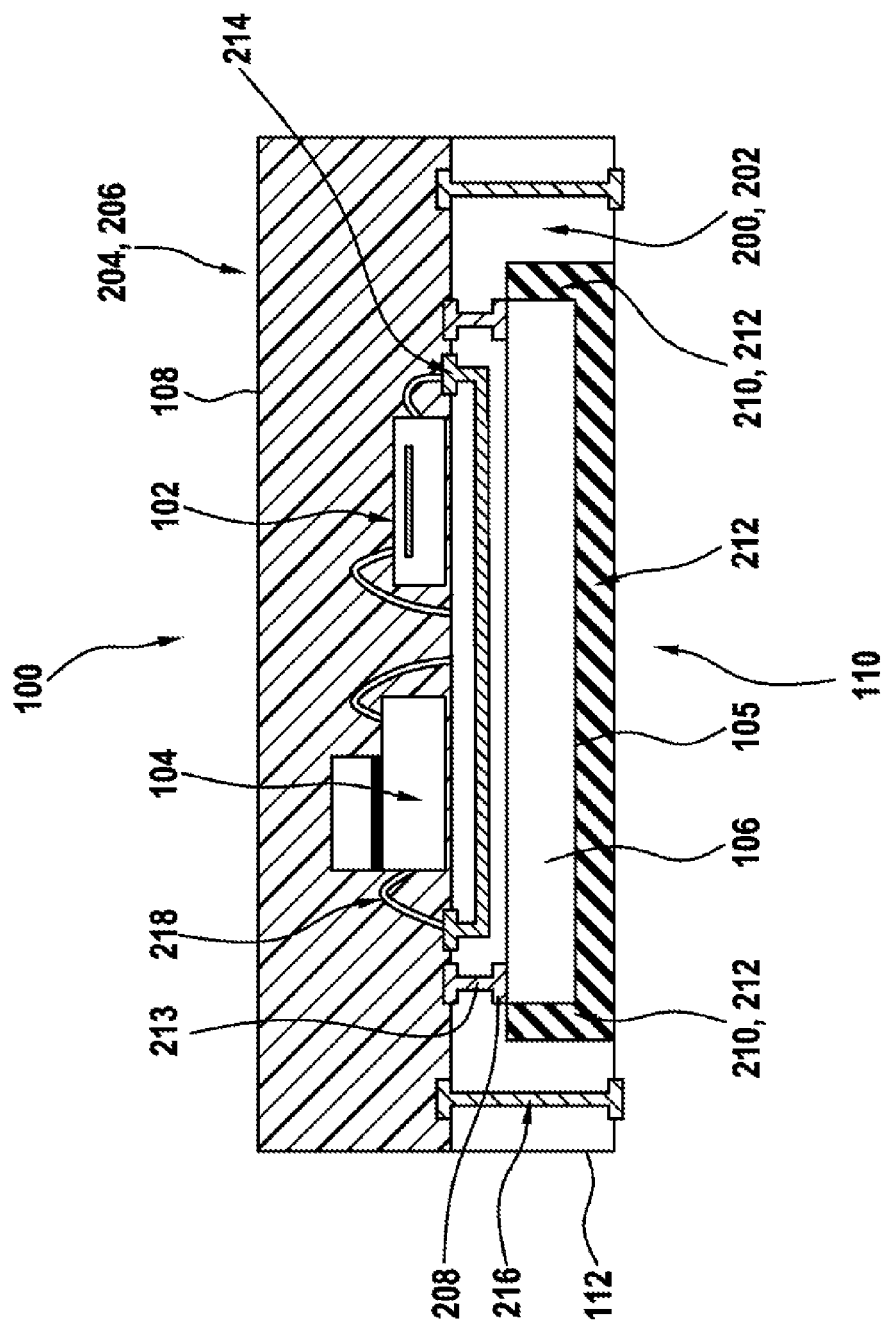
FIG. 2 shows an illustration of a sensor with sealed photovoltaic side edges in accordance with an exemplary embodiment of the present disclosure.

FIG. 2 shows an illustration of a sensor 100 with sealed photovoltaic cell side edges in accordance with an exemplary embodiment of the present disclosure. The sensor 100 may correspond to the sensor shown in FIG. 1. Additionally to FIG. 1, the housing 108 here has a first housing part 200 formed from a printed circuit board material 202 and a second housing part 204 formed from a potting compound (molding compound) 206. The recess 110 with the photovoltaic cell 106 is arranged in the first housing part 200. In this exemplary embodiment the recess 110 has been produced by means of material-removing machining. The photovoltaic cell 106 is formed as a back-contact cell and is adhesively bonded to contact pads 208 in the recess 110 with use of conductive adhesive. The photovoltaic cell 106 may also be soldered to the contact pads 208 with use of solder. A gap 210 extends around the photovoltaic cell 106 between the rim 112 and the photovoltaic cell 106. In order to protect the sensitive photovoltaic cell side edges, the gap 210 is sealed with a protective gel 212. The photovoltaic cell side edges can be protected by the protective gel 212. Optionally, the entire remaining recess 110 can be sealed with the protective gel 212. Then, the light-sensitive surface of the photovoltaic cell 106 can also be protected.

Conductive tracks 214 are integrated in the first housing part 200. Inter alia, the first housing part 200 has electrical feedthroughs (vias) 216. The electrical feedthroughs 216 may extend completely through the first housing part 200. By way of example, an electrical feedthrough 216 may extend from the outer surface of the rim 212 to a surface of the first housing part 200 adjacent to the second housing part 204. Further feedthroughs 213 may extend from the surface of the first housing part 200 adjacent to the second housing part 204 as far as the contact pads 208 of the photovoltaic cell 106. A conductive track 214 may extend parallel to an interface between the first housing part 200 and the second housing part 204 in a portion of the first housing part 200 spanning the light-insensitive side 105 of the photovoltaic cell 106. A conductive track 214 of this type may be electrically connected to contacts arranged at the interface between the first housing part 200 and the second housing part 204 in order to contact the sensor element 102 and the electrical circuit 104.

The conductive tracks 214 are embedded in part in the printed circuit board material 202. The sensor element 102 and the electrical circuit 104 are arranged on a rear side of the first housing part 200 opposite the recess 110. The sensor element 102 and the electrical circuit 104 are formed as integrated components (ASICS, MEMS) based on a semiconductor material and are connected via contact wires (wire bonds) 218 to the conductive tracks 214 of the first housing part 200.

The second housing part 204 is formed as a protective sleeve around the sensor element 102 and the electrical circuit 104. The sensor element 102 and the electrical circuit 104 are embedded in the second housing part 204. The rim 112 is defined by the recess 110 on one side and side surfaces of the housing 108 on the other side. The rim 112 is flush with the side surfaces. Feedthroughs 216 are likewise arranged in the rim 112 and reach as far as a surface of the housing 108.

Figure 3:
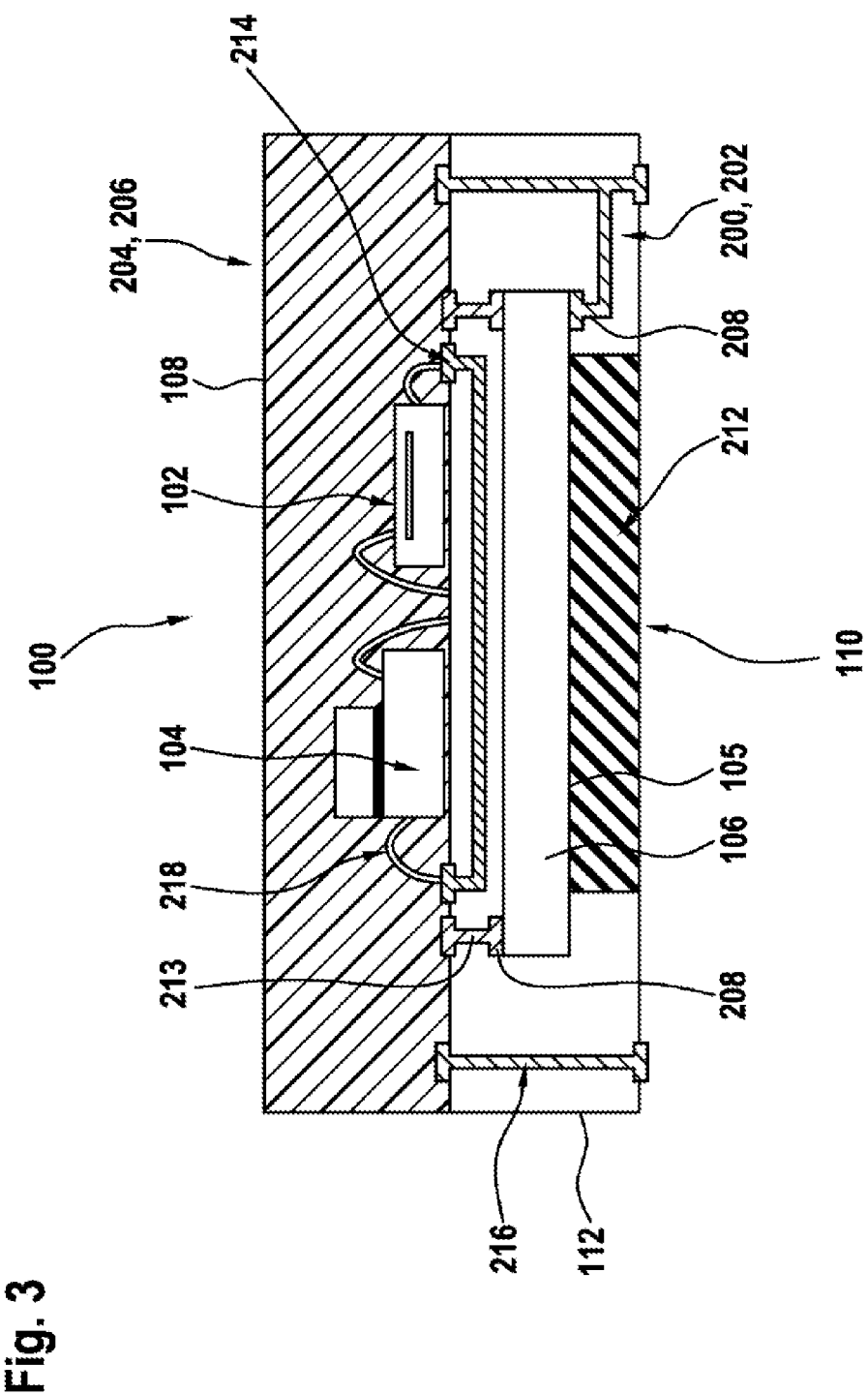
FIG. 3 shows an illustration of a sensor with photovoltaic cell side edges embedded in a printed circuit board in accordance with an exemplary embodiment of the present disclosure.

FIG. 3 shows an illustration of a sensor 100 with photovoltaic cell side edges embedded in a printed circuit board 202 in accordance with an exemplary embodiment of the present disclosure. The sensor 100 corresponds to the sensor in FIG. 3. In contrast to FIG. 3, here there is no gap between the rim 112 and the photovoltaic cell 106. Here the lateral edge of the photovoltaic cell 106 is embedded in the printed circuit board material 202 of the first housing part 200. The rim 112 surrounds the edge completely and extends in a rim region over the photovoltaic cell 106 on the light-sensitive side 105 of the photovoltaic cell 106. The lateral protection of the solar cell 106 prevents influences, such as moisture or mechanical damage, on the edges of the photovoltaic cell 106, at which the sensitive semiconductor region is located. By way of example, it is thus possible to prevent moisture from short-circuiting the sensitive p-n semiconductor junction.

In FIG. 3 the photovoltaic cell 106 is integrated in the printed circuit board 202 by means of embedding. In other words FIG. 3 shows a further variant of the approach presented here. The photovoltaic cell 106 is integrated directly in the printed circuit board 202 by means of embedding technology. In this case the lateral protection and the protrusion 112 are provided using printed circuit board materials 202. The embedding technology may also be used for electrical contacting of the chips 102, 104 in the printed circuit board 202. For the integration of a photovoltaic cell 106 in the printed circuit board 202, not only is good edge protection thus provided, but it is thus also possible to electrically contact photovoltaic cells 106 with contacts 208 on both sides, i.e. on the underside and the upper side. As is the case with the previously described variant, a gel 212 can also be filled here into the cavity 110 for protection. A lateral distance of the photovoltaic cell 106 from the printed circuit board 202 as in FIG. 2 is not provided here.

The protrusion 112 of the housing 108 beyond the base area of the photovoltaic cell 106 provides a number of advantages. The cell area of the active photovoltaic cell is protected against mechanical influences caused by placement on surfaces. The lateral protrusion 112 together with the cell area of the photovoltaic cell forms a cavity 110, in which an additional, for example transparent, protection medium at 212, such as gel, paint or melt, can be easily deposited for the active surface of the photovoltaic cell 106. If the lateral protrusion 112 is provided by a printed circuit board 202, electrical contacts 216 can thus be guided outwardly at the same time.

The vertical protrusion 112 may also envelope or cover the active surface of the photovoltaic cell 106 at the sides to a certain extent. If in this case a printed circuit board material 202 is used (embedding of the PV cell 106 in a printed circuit board 202), it is thus possible to contact a photovoltaic cell 106 both on the front side and on the rear side using standard printed circuit board technology, as illustrated in FIG. 3. This is advantageous since photovoltaic cells 106 with a contact on both the front side and rear side are widespread and economical.

In FIG. 3 the photovoltaic cell 106 is thus integrated in a monolayer or multi-layer printed circuit board 202. Here the photovoltaic cell 106 is glued for example in a blind bore 110 located in the printed circuit board 202. The gap 210 results here from a necessary distance due to a process tolerance and is filled after the gluing, possibly with protective gel 212.

In accordance with an exemplary embodiment FIG. 3 shows a variant of the design of an autonomous sensor system 100. Here an indentation is milled or drilled into the printed circuit board 202, into which indentation the photovoltaic cell 106 is subsequently introduced by means of adhesive, for example conductive adhesive for the contacts 208. Due to the process tolerances, a lateral distance 210 from the printed circuit board 202 is provided, which can then be sealed by way of example using a protective gel 212. This variant enables simple contacting of the photovoltaic cell 106, which has the two contacts 208 on the rear side, i.e. the side 105 of the photovoltaic cell 106 not facing toward a light source. It is also advantageous that electrical contacts 216 can be guided through the printed circuit board 202 by means of standard technologies of printed circuit board manufacturers. Both sides of the printed circuit board 202 can thus be interconnected, whereby a simple contacting of the system 100 from outside is possible.

Figure 4:
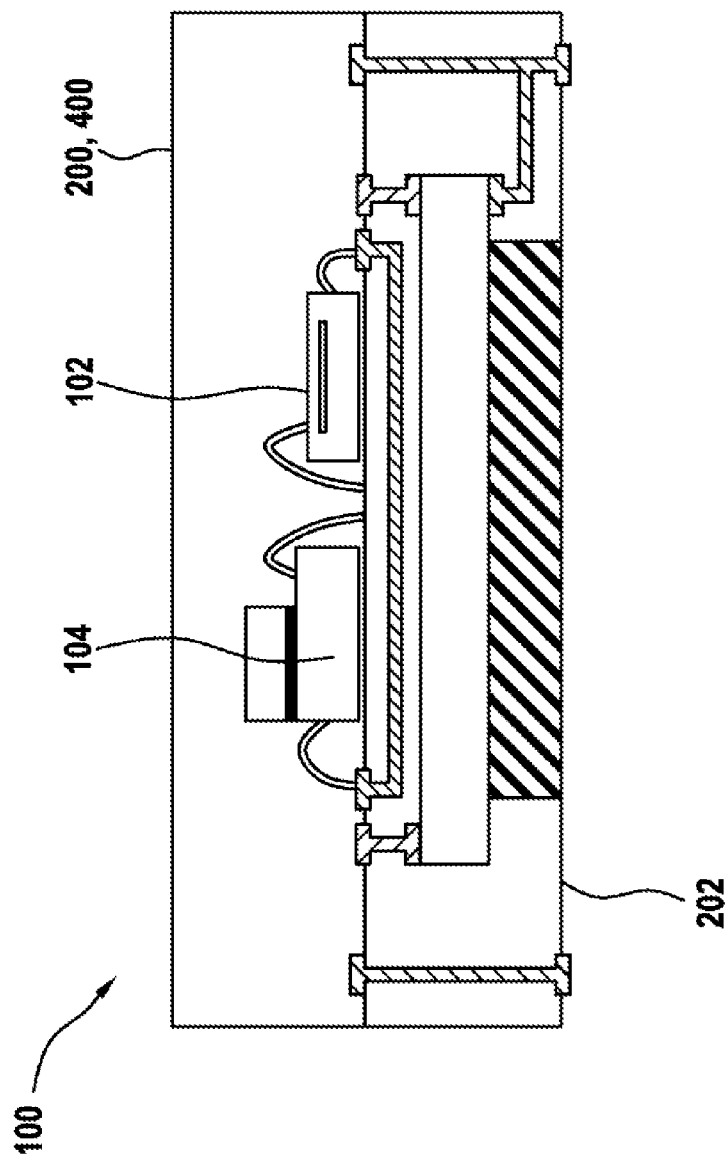
FIG. 4 shows an illustration of a sensor with photovoltaic cell side edges embedded in a printed circuit board and with a cover in accordance with an exemplary embodiment of the present invention disclosure.

FIG. 4 shows an illustration of a sensor 100 with photovoltaic cell side edges embedded in a printed circuit board 202 and with a cover 400 in accordance with an exemplary embodiment of the present disclosure. The sensor 100 corresponds to the sensor in FIG. 3. In contrast to FIG. 3, the second housing part 204 is formed here as a cover 400 made of metal or plastic. The cover 400 represents an alternative protection for the sensor element 102 and the electrical circuit 104. The cover 400 can be used instead of the molding compound. The cover 400 may be fitted onto the peripheral outer rim of the printed circuit board 202, such that a rim of the cover 400 terminates flush with a rim of the printed circuit board 202. The cover 400 surrounds the elements 102, 104 arranged on the printed circuit board 202. The elements 102, 104 are connected via bond wires to contacts of the printed circuit board 202.

Figure 5:
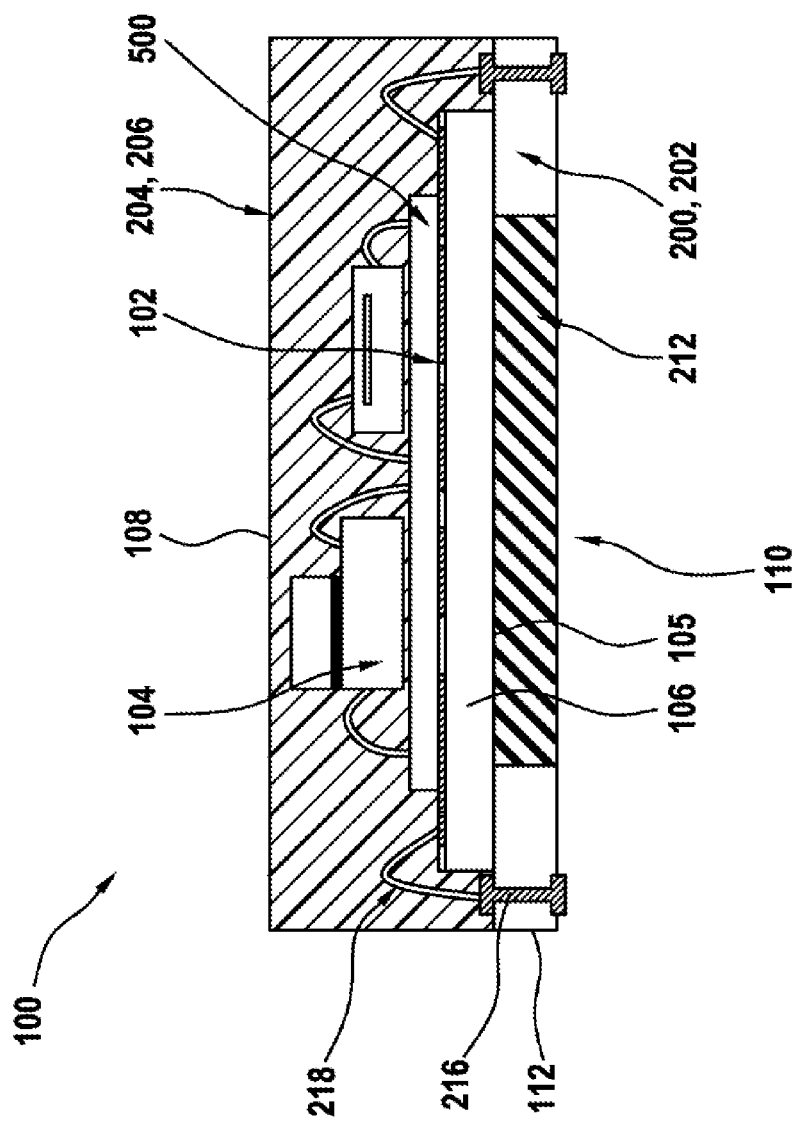
FIG. 5 shows an illustration of a sensor with a housing formed from potting compound and printed circuit board material in accordance with an exemplary embodiment of the present disclosure.

FIG. 5 shows an illustration of a sensor 100 with a housing 108 formed from potting compound 206 and printed circuit board material 202 in accordance with an exemplary embodiment of the present disclosure. The sensor 100 corresponds to the sensor in FIG. 3. In contrast to FIG. 3 the printed circuit board material 202 lies on the edge of the photovoltaic cell 106 only on the front side 105, i.e. the light-sensitive side 105 of the photovoltaic cell 106. The side surface and rear side of the photovoltaic cell 106 are embedded in potting compound 206. The first housing part 200 formed from the printed circuit board material 202 consists here of a ring running around the photovoltaic cell 106, said ring forming the rim 112 and at least part of the recess 110. A further part of the recess 110, which in accordance with this exemplary embodiment is filled completely by the photovoltaic cell 106, is formed by the potting compound 206. The photovoltaic cell 106 is aligned with the ring formed by the housing part 200, such that the photovoltaic cell is completely closed on the light-sensitive side of the photovoltaic cell 106 by the part of the recess 110 formed by the ring. In accordance with this exemplary embodiment the light-sensitive side of the photovoltaic cell 106 and the ring formed by the housing part 200 overlap, such that a peripheral rim region of the light-sensitive side of the photovoltaic cell 106 is carried by the housing part 200. Before the potting compound 206 is applied, the photovoltaic cell 106 is connected with feedthroughs 116 in the first housing part 200. Furthermore, a further printed circuit board 500 with structures for rewiring is arranged on the rear side of the photovoltaic cell 106, on which the sensor element 102 and the electrical circuit 104 are wired.

The photovoltaic cell 106 is connected to the electrical circuit 104 via the further printed circuit board 500. The sensor element 102 and the electrical circuit 104 are embedded with the further printed circuit board 500 in the potting compound 206.

In other words FIG. 5 shows a hybrid solution formed of printed circuit board 202 and molding compound 206. The ASICS/MEMS sensors 102, 104 are embedded with the conductive tracks 500 and the wire bonds 218 and the rear side of the PV cell 106 in the molding compound 206. Electrical vias 216 penetrate the rim 112 of the printed circuit board 200. The recess 110 can be filled optionally with protective gel. The protective function may be ensured in part by printed circuit board material 202 and in part by molding compound 206. In this variant the rewiring 500 is performed on the solar cell 106, and the printed circuit board 200 or the printed circuit board frame 112 serves merely to guide out the electrical contacts 216 for functionality tests. The solar cell 106 is surrounded here laterally by molding compound 206, and the protrusion 112 is provided by printed circuit board material 202. Here, protective material 212 may also be introduced optionally into the cavity 110.

Figure 6:
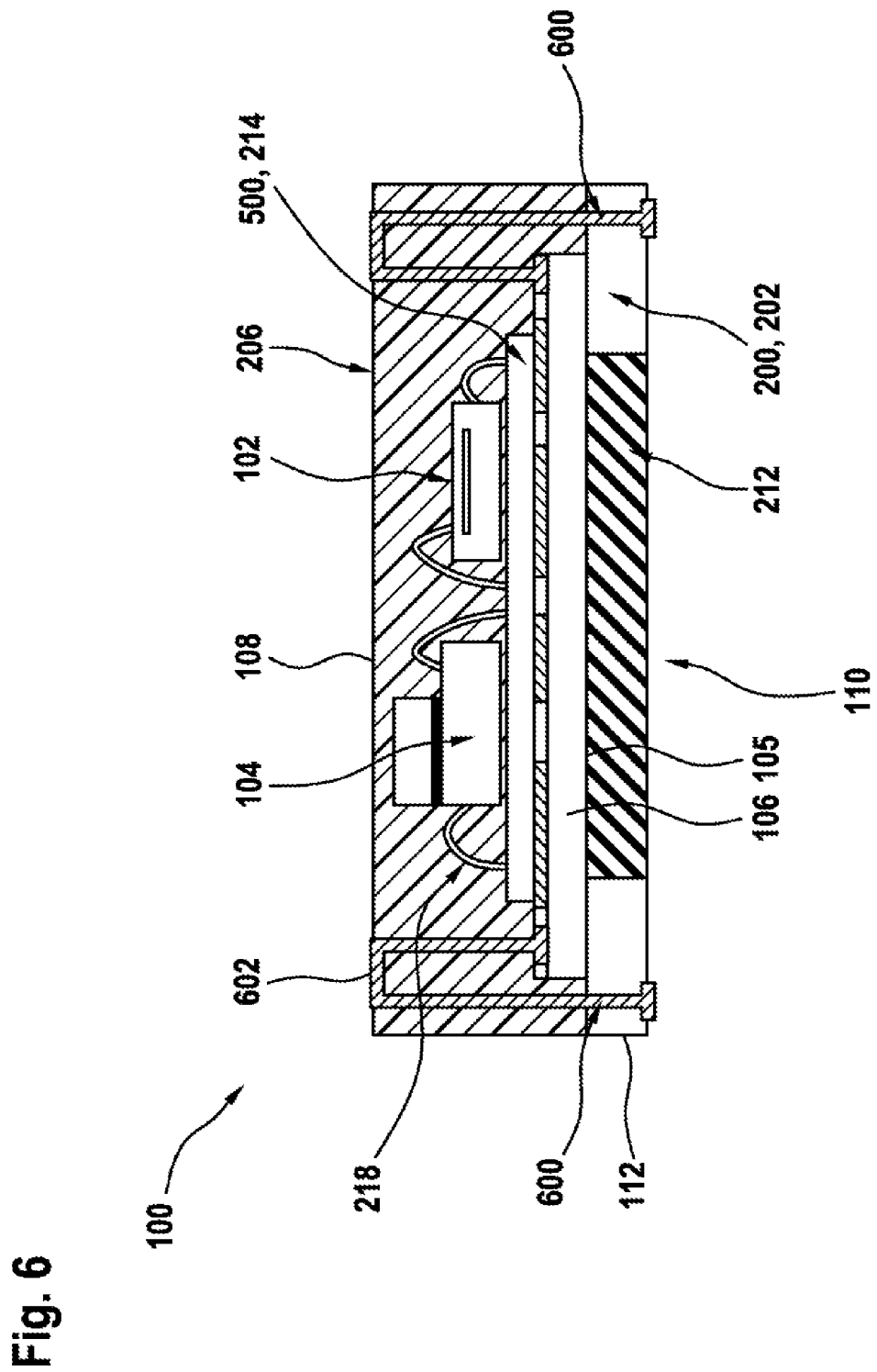
FIG. 6 shows an illustration of a sensor with a housing formed from potting compound in accordance with an exemplary embodiment of the present disclosure.

FIG. 6 shows an illustration of a sensor 100 with a housing 108 formed from potting compound 206 in accordance with an exemplary embodiment of the present disclosure. The sensor 100 corresponds to the sensor in FIG. 5. In contrast to FIG. 5, the housing 108 here is formed in one piece and completely from potting compound 206. The photovoltaic cell 106 is embedded at the rear side and at the edge in the potting compound 206. As in FIG. 5 the sensor element 102 and the electrical circuit 104 are arranged on the structure for rewiring 500 having conductive tracks 214, which is secured and wired on the rear side of the photovoltaic cell 106. U-shaped cast-in feedthroughs 600 connect a front side 105 of the sensor 100 to a rear side of the sensor 100 and the photovoltaic cell 106. The feedthroughs 600 run through the rim 112, behind the side surfaces of the sensor 100 to enlarged contact surfaces 602 on the rear side of the sensor 100. In other words FIG. 6 shows a photovoltaic cell 106 encased by molding compound 206. Here, the protection is ensured by molding compound 206 and not by a printed circuit board. The rewiring 500 of the sensors 102 may be performed directly on the solar cell 106. From a technological viewpoint, this variant may be provided for example by film molds, with which molding is performed from above and below at the same time. A tool may be provided on the underside, which tool exposes the photovoltaic cell 106, as indicated. Electrical contacts 602 may be guided outwardly, for example by means of mold vias 600. A process-induced lateral distance between the photovoltaic cell 106 and the molding compound 206 as in FIG. 2 is not provided here.

Figure 7:
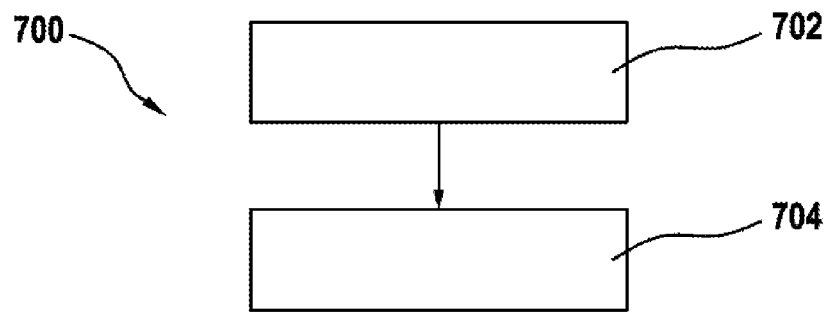
FIG. 7 shows a flow diagram of a method for producing a sensor in accordance with an exemplary embodiment of the present disclosure.

FIG. 7 shows a flow diagram of a method 700 for producing a sensor 100 in accordance with an exemplary embodiment of the present disclosure. The method 700 has a provision step 702 and an arrangement step 704. In the provision step 702 a sensor element, an electrical circuit and a photovoltaic cell are provided, wherein the photovoltaic cell is connected to the electrical circuit and the electrical circuit is connected to the sensor element. In the arrangement step 704 the sensor element, the electrical circuit and the photovoltaic cell are arranged in a housing, wherein the photovoltaic cell is arranged in a recess in the housing and a rim of the housing surrounding the recess protrudes beyond the photovoltaic cell.

Figure 8:
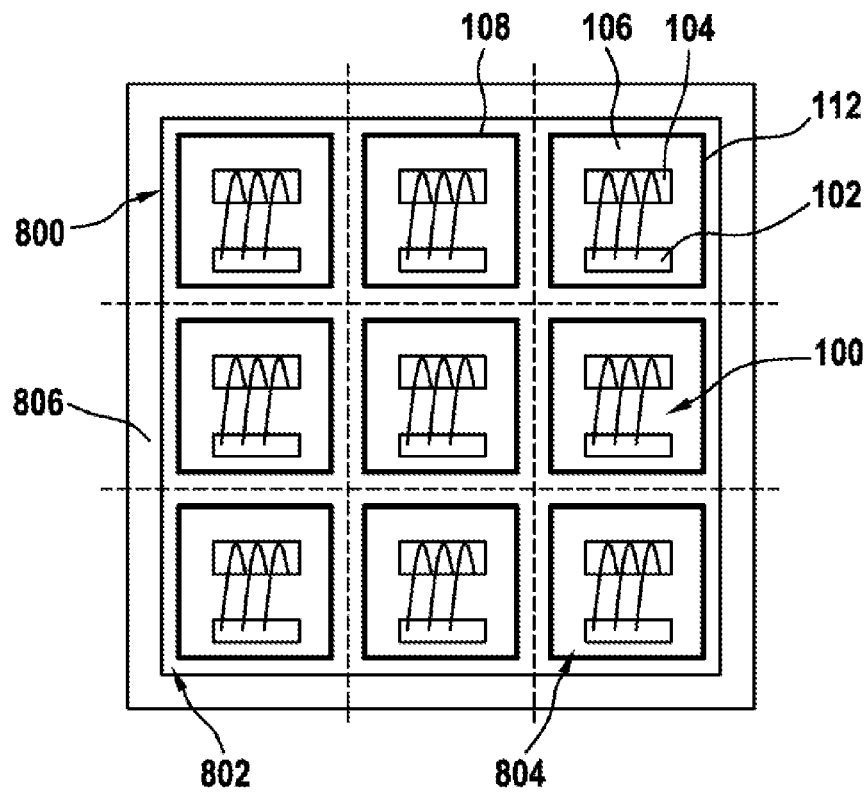
FIG. 8 shows an illustration of a plurality of sensors embedded together in accordance with an exemplary embodiment of the present disclosure.

FIG. 8 shows an illustration of a plurality of sensors 100 embedded together in accordance with an exemplary embodiment of the present disclosure. The sensors 100 may correspond to one of the exemplary embodiments described here. The sensors 100 are arranged in a grid. Here, by way of example, nine identical sensors are arranged in three rows and three columns. Each sensor 100, similarly to the sensor illustrated in FIG. 1, has a sensor element 102, an electrical circuit 104, a photovoltaic cell 106 and a housing 108. The housing 108 is approximately square here. Each photovoltaic cell 106, which likewise are approximately square, is arranged centrally in the housing 108, such that the rim 112 protrudes beyond the photovoltaic cell 106, around said cell, in order to protect said cell. The sensor element 102 and the electrical circuit 104 are arranged adjacently in the housing 108. The sensor element 102 and the electrical circuit 104 are wired to one another and are arranged in another plane above the photovoltaic cell 106. The housing 108 surrounds the photovoltaic cell 106 at least by means of the rim 112 and surrounds the sensor element 102 and the electrical circuit 104 completely.

The housing 108 may be formed as a one-piece overall housing for all sensors 100 together in a multi-cavity tool. The housings 108 may also be formed individually. In the case of a multi-cavity tool, the photovoltaic cell 106, the sensor element 102 and the electrical circuit 104 may be arranged with use of a film 800. The film 800 may be mounted outside the multi-cavity tool and then inserted with all components into the multi-cavity tool in order to be encapsulated with potting compound 206 by injection molding.

In other words, FIG. 8 shows an array arrangement of photovoltaic cells 106 on a temporary substrate 800. The molding regions from the upper side 802 and from the underside 804 are also illustrated. The temporary substrate may be a film 800, for example. Each photovoltaic cell 106 may be arranged with the MEMS/ASIC 102, 104 and wire bonds 218 on the film 800. Saw lines 806, along which the sensors 100 are separated, extend between the sensors 100. In order to mold the molding compound 206, the tool may reproduce contours from above 802 and from below 804 in the sensors 100. The lateral mold protection can be provided by arranging the photovoltaic cells 106 on a temporary substrate 800 (for example adhesive film) in an array prior to the molding, as illustrated in FIG. 8. This array is then overmolded and the individual sensor elements 100 are ultimately processed by the subsequent separation along the saw lines 806 (sawing).

The approach presented here may be used for (partially) autonomous sensors 100 from the field of the "Internet of Things" with focus on cost reduction and/or large quantities.

The exemplary embodiments described and shown in the figures have been selected merely by way of example. Different exemplary embodiments may be combined with one another completely or in respect of individual features. An exemplary embodiment may also be supplemented by features of a further exemplary embodiment. Furthermore, method steps according to the disclosure can be repeated and performed in an order other than that described. If an exemplary embodiment includes an "and/or" link between a first feature and a second feature, this is thus to be read such that the exemplary embodiment in accordance with one embodiment includes both the first feature and the second feature and in accordance with a further embodiment includes either only the first feature or only the second feature.

The invention claimed is:

1. A sensor comprising:
   a sensor element configured to provide a sensor signal representing at least one measurand detected by the sensor element;
   an electrical circuit configured to process the sensor signal to form a data signal;
   a photovoltaic cell configured to provide electrical energy for the sensor element and the electrical circuit; and
   a housing including a first housing part and a second housing part, the first housing part including a recess in a front side of the first housing part in which the photovoltaic cell is positioned, and a rim surrounding the recess and protruding beyond the photovoltaic cell, the sensor element and the electrical circuit being mounted to a rear side of the first housing part opposite the recess and enclosed on the rear side by the second housing part,
   wherein the rim is formed from a printed circuit board material.

2. The sensor as claimed in claim 1, further comprising a junction region between the photovoltaic cell and the first housing part that is sealed in a region of a solar-active surface of the photovoltaic cell with a protective medium that is at least partially transparent to solar radiation.

3. The sensor as claimed in claim 1, the sensor element and/or the electrical circuit being positioned on a light-insensitive side of the photovoltaic cell.

4. The sensor as claimed in claim 1, wherein the second housing part is formed by a potting compound and the sensor element and/or the electrical circuit is potted at least partially in the potting compound.

5. The sensor as claimed in claim 1, further comprising electrical conductor tracks positioned in the rim, wherein the photovoltaic cell is electrically contacted in the rim at least on one side by the conductive tracks by feedthroughs.

6. The sensor as claimed in claim 1, wherein the photovoltaic cell is surrounded by the rim such that there is contact at least on all sides with the surfaces of the photovoltaic cell, at least in sub-regions of the surfaces.

7. The sensor as claimed in claim 1, wherein a solar-active side of the photovoltaic cell is covered at least in part by the rim.

8. The sensor as claimed in claim 1, further comprising electrical connectors on the rim and/or on the rear side of the first housing part opposite the recess.

9. A method for producing a sensor comprising:
providing a sensor element, an electrical circuit and a photovoltaic cell, the photovoltaic cell being connected to the electrical circuit and the electrical circuit being connected to the sensor element; and
positioning the sensor element, the electrical circuit and the photovoltaic cell in a housing, the housing having a first housing part and a second housing part, the photovoltaic cell being positioned in a recess in a front side of the first housing part, the sensor element and the electrical circuit being mounted to a rear side of the first housing part opposite the recess and enclosed on the rear side by the second housing part,
wherein a rim of the housing surrounds the recess and protrudes beyond the photovoltaic cell, the rim being formed from a printed circuit board material.

10. A method comprising:
providing a plurality of arrangements formed of a sensor element, an electrical circuit and a photovoltaic cell, wherein the photovoltaic cell of each arrangement is connected to a respective electrical circuit of each arrangement, and the electrical circuit of each arrangement is connected a respective sensor element of each arrangement;
positioning each of the plurality of arrangements in a common housing; and
separating the housing into a plurality of sub-housings, wherein each sub-housing includes a first part and a second part, the first part including a recess in a front side in which the photovoltaic cell of a respective one of the plurality of arrangements is positioned, the sensor element and the electrical circuit of the respective one of the plurality of arrangements being mounted to a rear side of the first part opposite the recess and enclosed on the rear side by the second housing part, and
wherein the first part of each of the sub-housings includes a rim that surrounds the recess and protrudes beyond the photovoltaic cell positioned in the recess, the rim being formed from a printed circuit board material.

* * * * *